US011107832B2

(12) United States Patent
Huang et al.

(10) Patent No.: US 11,107,832 B2
(45) Date of Patent: Aug. 31, 2021

(54) APPARATUSES INCLUDING MEMORY CELLS AND RELATED METHODS

(71) Applicant: Micron Technology, Inc., Boise, ID (US)

(72) Inventors: Guangyu Huang, Boise, ID (US); Haitao Liu, Boise, ID (US); Chandra V. Mouli, Boise, ID (US); Srinivas Pulugurtha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/822,696

(22) Filed: Mar. 18, 2020

(65) Prior Publication Data

US 2020/0219899 A1    Jul. 9, 2020

Related U.S. Application Data

(63) Continuation of application No. 16/111,357, filed on Aug. 24, 2018, now Pat. No. 10,608,012.

(Continued)

(51) Int. Cl.
*H01L 27/11582*    (2017.01)
*H01L 21/02*    (2006.01)
(Continued)

(52) U.S. Cl.
CPC .. *H01L 27/11582* (2013.01); *H01L 21/02529* (2013.01); *H01L 21/02532* (2013.01);
(Continued)

(58) Field of Classification Search
None
See application file for complete search history.

(56) References Cited

U.S. PATENT DOCUMENTS

| 8,513,073 B1 | 8/2013 | Basker et al. |
| 8,530,350 B2 | 9/2013 | Freeman et al. |

(Continued)

OTHER PUBLICATIONS

Bayraktaroglu et al., Microwave ZnO Thin-Film Transistors, IEEE Electron Device Letters, vol. 29, No. 9, Sep. 2008, pp. 1024-1026.

(Continued)

*Primary Examiner* — Anthony Ho
*Assistant Examiner* — Kevin Quinto
(74) *Attorney, Agent, or Firm* — TraskBritt (57) ABSTRACT

Memory devices and electronic systems include an array of vertical memory cells positioned along respective vertical channels to define vertical memory strings. Each of the vertical channels includes a channel material exhibiting an electron mobility of at least about 30 cm$^2$/(V·s) and a room temperature band gap of at least about 1.40 eV (e.g., zinc oxide, silicon carbide, indium phosphide, indium gallium zinc oxide, gallium arsenide, or molybdenum disulfide) and a bottom plug material exhibiting a room temperature band gap of less than about 1.10 eV (e.g., silicon germanium, germanium, or indium gallium arsenide). Methods of fabricating a memory device include forming such a bottom plug material within vertical channels and forming such a channel material electrically coupled to the bottom plug material.

20 Claims, 9 Drawing Sheets

Related U.S. Application Data (60) Provisional application No. 62/551,347, filed on Aug. 29, 2017.

(51) Int. Cl.

| | | |
|---|---|---|
| *H01L 29/16* | (2006.01) | |
| *H01L 29/20* | (2006.01) | |
| *H01L 29/24* | (2006.01) | |
| *H01L 29/04* | (2006.01) | |
| *H01L 29/165* | (2006.01) | |
| *H01L 29/66* | (2006.01) | |
| *H01L 29/22* | (2006.01) | |
| *H01L 21/28* | (2006.01) | |

(52) U.S. Cl.
CPC .. *H01L 21/02543* (2013.01); *H01L 21/02546* (2013.01); *H01L 21/02554* (2013.01); *H01L 21/02565* (2013.01); *H01L 21/02568* (2013.01); *H01L 29/04* (2013.01); *H01L 29/16* (2013.01); *H01L 29/165* (2013.01); *H01L 29/1608* (2013.01); *H01L 29/20* (2013.01); *H01L 29/22* (2013.01); *H01L 29/24* (2013.01); *H01L 29/40117* (2019.08); *H01L 29/66833* (2013.01)

(56) References Cited

U.S. PATENT DOCUMENTS

| | | | |
|---|---|---|---|
| 8,766,320 | B2 | 7/2014 | Liu et al. |
| 9,177,872 | B2 | 11/2015 | Sandhu |
| 9,209,199 | B2 | 12/2015 | Simsek-Ege et al. |
| 9,240,420 | B2 | 1/2016 | Rabkin et al. |
| 9,281,318 | B2 | 3/2016 | Liu et al. |
| 9,412,821 | B2 | 8/2016 | Simsek-Ege et al. |
| 9,437,604 | B2 | 9/2016 | Lu et al. |
| 9,536,618 | B2 | 1/2017 | Zhao et al. |
| 2005/0001288 | A1* | 1/2005 | Hueting ............ H01L 29/42304 257/565 |
| 2010/0213458 | A1 | 8/2010 | Prall |
| 2010/0224929 | A1* | 9/2010 | Jeong ................ H01L 27/11578 257/324 |
| 2014/0264525 | A1 | 9/2014 | Takahashi et al. |
| 2015/0137114 | A1 | 5/2015 | Yi et al. |
| 2016/0104719 | A1 | 4/2016 | Jung et al. |
| 2016/0149004 | A1 | 5/2016 | Rabkin et al. |
| 2017/0053986 | A1 | 2/2017 | Liu et al. |

OTHER PUBLICATIONS

Date et al., Suppression of the Floating-Body Effect Using SiGe Layers in Vertical Surrounding-Gate MOSFETs, IEEE Transactions on Electron Devices, vol. 48, No. 12, Dec. 2001, pp. 2684-2689.

Fortunato et al., Wide-Bandgap High-Mobility ZnO Thin-Film Transistors Produced at Room Temperature, Applied Physics Letters, vol. 85, No. 13, Sep. 27, 2004, pp. 2541-2543.

Hong et al., High-Performance SiGe Epitaxial Base Bipolar Transistors Produced by a Reduced-Pressure CVD Reactor, IEEE Electron Device Letters, vol. 14, No. 9, Sep. 1993, pp. 450-452.

Hwang et al., Vertical Channel ZnO Thin-Film Transistors Using an Atomic Layer Deposition Method, IEEE Electron Device Letters, vol. 35, No. 3, Mar. 2014, pp. 360-362.

Pearton et al., Advanced in Processing of ZnO, Elsevier, Zinc Oxide Bulk, Thin Films and Nanostructures, Processing, Properties and Applications, (2006), Chapter 9, pp. 314-317.

Pillai et al., Transport Mechanism in Sub 1000° C. Processed High Mobility Polycrystalline ZnO Transparent Thin Film Transistors, 2015 IEEE International Electron Devices Meeting (IEDM), Dec. 7-9, 2015, 28.1.1-28.1.4.

\* cited by examiner

APPARATUSES INCLUDING MEMORY CELLS AND RELATED METHODS

CROSS-REFERENCE TO RELATED APPLICATIONS

This application is a continuation of U.S. patent application Ser. No. 16/111,357, filed Aug. 24, 2018, now U.S. Pat. No. 10,608,012, issued Mar. 31, 2020, which is a utility conversion of U.S. Provisional Patent Application Ser. No. 62/551,347, filed Aug. 29, 2017, titled "Memory Devices Including Vertical Memory Cells and Related Methods," the disclosure of each of which is hereby incorporated herein in its entirety by this reference.

TECHNICAL FIELD

Embodiments disclosed herein relate to memory devices and electronic systems including vertical memory cells, such as so-called "three-dimensional (3D) memory devices." Embodiments also relate to methods of forming memory devices including vertical memory cells.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize architectures including an array of vertical memory cells (also referred to as "three-dimensional (3D) memory devices"). A conventional array of vertical memory cells includes semiconductor pillars as channels extending through openings in a stack of alternating conductive gate materials (e.g., word lines, control gates, access lines) and dielectric materials at each junction of the semiconductor pillars and the conductive structures. The vertical memory cells define a vertical memory string along each pillar. Such a configuration permits a greater number of memory cells to be located in a given unit of die surface area by building the array upwards (e.g., vertically) on a die, as compared to structures with conventional planar (e.g., two-dimensional) arrangements of cells.

An example of an array of vertical memory cells is a so-called "MONOS"-type memory array, which stands for metal-oxide-nitride-oxide-semiconductor, referring to the materials forming each individual vertical memory cell. Conventional MONOS-type memory arrays may be formed by forming the semiconductor pillars through a stack of alternating first and second dielectric materials, forming openings through the stack adjacent to the semiconductor pillars, removing the first dielectric materials through the openings, and replacing the first dielectric materials with a conductive material to form word line elements. During such a process, all or substantially all of the first dielectric material is replaced by the conductive material, such that a body of the vertical memory array includes alternating layers of the second dielectric material and the conductive gate materials. The semiconductor pillars function as a channel material for the vertical memory cells.

As technology advances in 3D memory devices, arrays of vertical memory cells are being produced and designed with an increased number of alternating conductive gate materials and dielectric materials to increase a number of transistors. This increase results in a stack with a greater height, and vertical memory strings also have an increased length in order to pass through the stack with the greater height. The semiconductor pillars (e.g., channel materials) in the longer vertical memory strings may need to carry an increased current to effectively operate all the vertical memory devices in a vertical memory string. Conventional polycrystalline silicon (also known as "polysilicon") exhibits a substantial number of defects and traps in the channels, and is also very sensitive to high operation temperatures, such as from 50° C. to 150° C. Polysilicon used in semiconductor channels exhibits an electron mobility of about 10 $cm^2/(V \cdot s)$ and a room temperature band gap of about 1.12 eV, which may not be sufficient to reliably and effectively operate all vertical memory devices in a vertical memory string having an increased length. Moreover, polysilicon channel materials may result in an insufficient gate-induced drain leakage ("GIDL") current for erase functions on such long vertical memory strings. Accordingly, polysilicon channel materials may not be suitable for use with an increasing number of stacked transistors.

DETAILED DESCRIPTION

The illustrations included herewith are not meant to be actual views of any particular systems or structures, but are merely idealized representations that are employed to describe embodiments of the present disclosure. Elements and features common between figures may retain the same numerical designation.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques and material types employed in the semiconductor industry. In addition, the description provided herein does not form a complete process flow for manufacturing memory devices and systems, and the structures described below do not form a complete memory device. Only those process acts and structures necessary for one of ordinary skill in the art to understand the embodiments described herein are described in detail below. Additional acts and structures to form a complete memory device and system may be accomplished by conventional techniques.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

As used herein, any relational term, such as "first," "second," "over," "top," "bottom," "underlying," etc., is used for clarity and convenience in understanding the disclosure and accompanying drawings and does not connote or depend on any specific preference, orientation, or order, except where the context clearly indicates otherwise.

As used herein, the terms "vertical" and "horizontal" merely refer to a drawing figure as oriented on the drawing sheet, and in no way are limiting of orientation of a device or any portion thereof.

As used herein, the terms "forming" and "formed" mean and include any method of creating, building, depositing, and/or patterning a material. For example, forming may be accomplished by atomic layer deposition (ALD), chemical vapor deposition (CVD), physical vapor deposition (PVD), sputtering, co-sputtering, spin-coating, diffusing, depositing, growing, or any other technique known in the art of semiconductor fabrication. Material may be formed and/or patterned into various shapes and configurations using known techniques, such as isotropic etching, anisotropic etching, chemical-mechanical polishing (CMP), ablating, etc. Depending on the specific material to be formed, the technique for forming the material may be selected by a person of ordinary skill in the art.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

According to some embodiments, memory devices and electronic systems of this disclosure may include an array of vertical memory cells positioned along respective vertical channels to define vertical memory strings. Each of the vertical channels may include a channel material exhibiting an electron mobility of at least about 30 cm$^2$/(V·s) and a room temperature band gap of at least about 1.40 eV (e.g., zinc oxide, silicon carbide, indium phosphide, indium gallium zinc oxide, or gallium arsenide, as well as so-called "2D materials," such as molybdenum disulfide), and a bottom plug material exhibiting a room temperature band gap of less than about 1.10 eV (e.g., silicon germanium, germanium, or indium gallium arsenide). Such channel materials may allow for an increase in string current as compared to certain conventional vertical memory strings with channel materials having lower electron mobility and lower band gaps. Such bottom plug materials may result in an increased GIDL current to facilitate erase operations of the respective vertical memory strings compared to certain conventional vertical memory strings with bottom plugs having higher band gaps.

Figure 1:
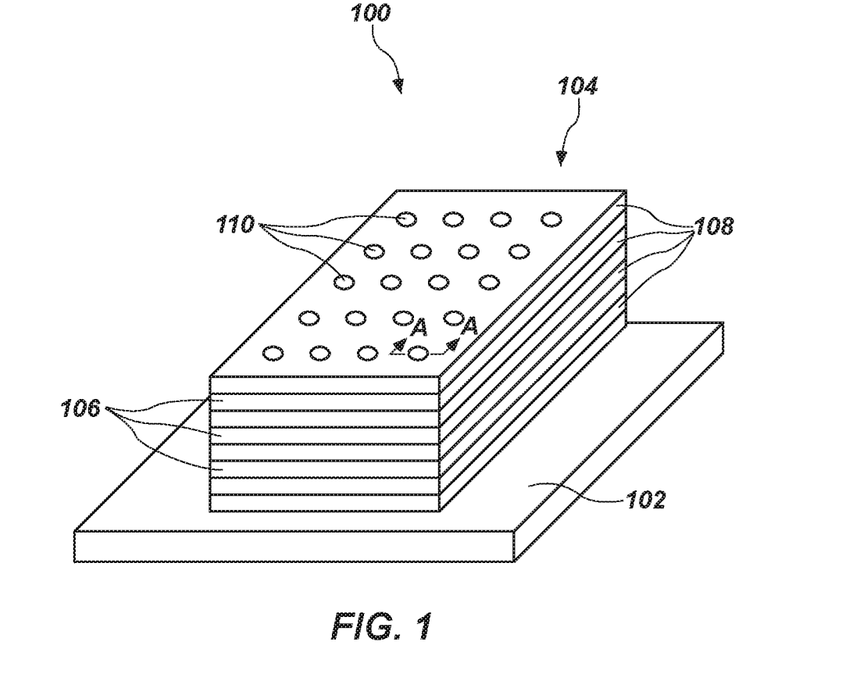
FIG. 1 is a perspective view of a portion of a memory device including a memory block over a substrate according to an embodiment of this disclosure.

FIG. 1 illustrates a portion of a memory device 100 according to an embodiment of the present disclosure that includes a substrate 102 and a stack 104 of alternating conductive gate materials 106 and dielectric materials 108 over the substrate 102. Vertical channels 110 may be arranged in an array and extend through the stack 104 of conductive gate materials 106 and dielectric materials 108. For clarity, peripheral portions, connections (e.g., a so-called "stair-step structure"), contacts, data lines (e.g., bit lines), surrounding insulating material, and other materials and structures of the memory device are not shown in FIG. 1. However, one of ordinary skill in the art will, upon consideration of this disclosure, understand how such other materials and structures may be used to provide a complete memory device 100.

Figure 2:
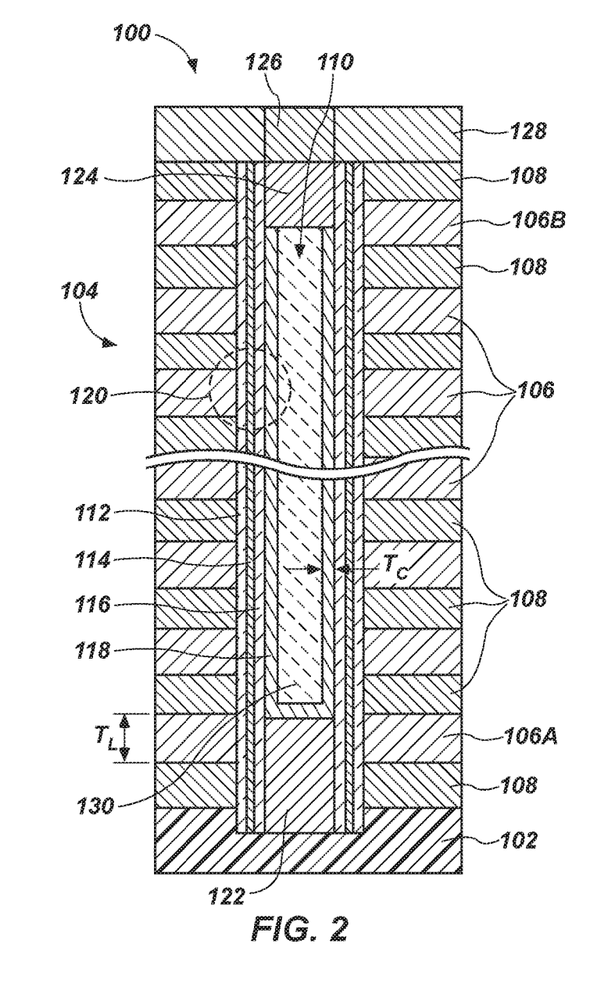
FIG. 2 is a cross-sectional side view of a vertical string of memory cells of a memory device according to an embodiment of this disclosure, taken at section line A-A of FIG. 1.

FIG. 2 illustrates a cross-sectional side view of the memory device 100 through one of the vertical channels 110 of the stack 104 and the underlying substrate 102. An outer oxide liner 112 may be positioned along a sidewall of and within the vertical channel 110, in contact with the stack 104 of alternating conductive gate materials 106 and dielectric materials 108. A nitride liner 114 may be positioned adjacent to, inside, and in contact with the outer oxide liner 112. An inner oxide liner 116 may be positioned adjacent to, inside, and in contact with the nitride liner 114. A channel material 118 may be positioned adjacent to, inside, and in contact with the inner oxide liner 116. An individual conductive gate material 106 and an adjacent portion of the outer oxide liner 112, nitride liner 114, inner oxide liner 116, and channel material 118 may define a vertical memory cell 120 of a so-called metal-oxide-nitride-oxide-semiconductor ("MONOS") configuration.

Within and at a base of the vertical channel 110, a bottom plug material 122 may be located between the substrate 102 and the channel material 118 of the vertical channel 110. The bottom plug material 122 may extend upward from the substrate 102 to at least partially vertically overlap a lowermost conductive gate material 106A. The lowermost conductive gate material 106A may have a vertical thickness $T_L$ that is greater than respective thicknesses of the other conductive gate materials 106 of the stack 104, to provide a larger margin of error when forming the bottom plug material 122 to at least partially vertically overlap the lowermost conductive gate material 106A. By way of example and not limitation, the vertical thickness $T_L$ of the lowermost conductive gate material 106A may be about 45 nm or greater, while the respective vertical thicknesses of the other conductive gate materials 106 may be about 35 nm.

Within and at a top portion of the vertical channel 110, a top plug material 124 may be located between the channel material 118 and a data line 126 (e.g., a bit line). The top plug material 124 may at least partially vertically overlap an uppermost conductive gate material 106B.

One or more (e.g., from one to five) of the lowermost conductive gate materials 106, 106A may be configured as select gate sources. One or more (e.g., from one to five) of the uppermost conductive gate materials 106, 106B may be configured as select gate drains. The conductive gate materials 106 between the select gate source(s) and the select gate drain(s) may be configured as access lines (e.g., word lines). There may be any suitable number of access lines in the stack 104, such as about 32, about 64, about 72, about 96, or about 128, for example.

A cap dielectric material 128, which may include one or more different dielectric materials, may be positioned over the stack 104 of alternating conductive gate materials 106 and dielectric materials 108, adjacent to the data line 126 (e.g., the data line 126 may extend horizontally through the cap dielectric material 128).

In some embodiments, the channel material 118 may be in the form of a liner having a sidewall thickness $T_C$ of less than about 25 nm, such as between about 5 nm and about 20 nm. The channel material 118 may be present along internal sidewalls of the inner oxide liner 116 and over a top surface of the bottom plug material 122, as illustrated in FIG. 2. A central dielectric 130 may be positioned adjacent to and within sidewalls of the channel material 118. The central dielectric 130 may be or include, for example, an oxide material or an air-filled void.

The channel material 118 may be, or include, a material that exhibits an electron mobility of at least about 30 $cm^2/(V·s)$, such as between about 40 $cm^2/(V·s)$ and about 50 $cm^2/(V·s)$, and a room temperature band gap of at least about 1.40 eV, such as about 3.3 eV. By way of example and not limitation, the channel material 118 may be or include zinc oxide, silicon carbide, indium phosphide, indium gallium zinc oxide, or gallium arsenide, as well as so-called "2D materials," such as molybdenum disulfide. The channel material 118 may include stoichiometric variations of the listed materials, and/or combinations of materials such as indium and gallium. The channel material 118 may have different composition ratios. By way of example and not limitation, zinc oxide exhibits an electron mobility of about 40 $cm^2/(V·s)$ and a room temperature band gap of about 3.3 eV. Zinc oxide also has an electron affinity of about 4.29 eV, which is close to polysilicon's electron affinity of about 4.1 eV. The bottom plug material 122 may be, or include, a material that exhibits a room temperature band gap of less than about 1.10 eV. By way of example and not limitation, the bottom plug material 122 may be or include silicon germanium (which has a room temperature band bap of about 0.85 eV), germanium (which has a room temperature band gap of about 0.66 eV), or indium gallium arsenide (which has a room temperature band gap of about 0.7 eV). The bottom plug material 122 may be doped with an n-type dopant.

Accordingly, embodiments of this disclosure include memory devices that include an array of vertical memory cells positioned along respective vertical channels to define vertical memory strings. Each of the vertical channels includes a channel material and a bottom plug material at a base of the vertical channel and electrically coupled to the channel material. The channel material exhibits an electron mobility of at least about 30 $cm^2/(V·s)$ and a room temperature band gap of at least about 1.40 eV. The bottom plug material exhibits a room temperature band gap of less than about 1.10 eV.

FIGS. 3-14 illustrate a method of forming a memory device including vertical strings of memory cells, at various stages of the method, according to an embodiment of this disclosure. For simplicity, the formation of a single vertical string of memory cells is illustrated, but will be understood by one of ordinary skill in the art that the method may include simultaneously forming multiple (e.g., an array of) vertical strings of memory cells.

Figure 3:
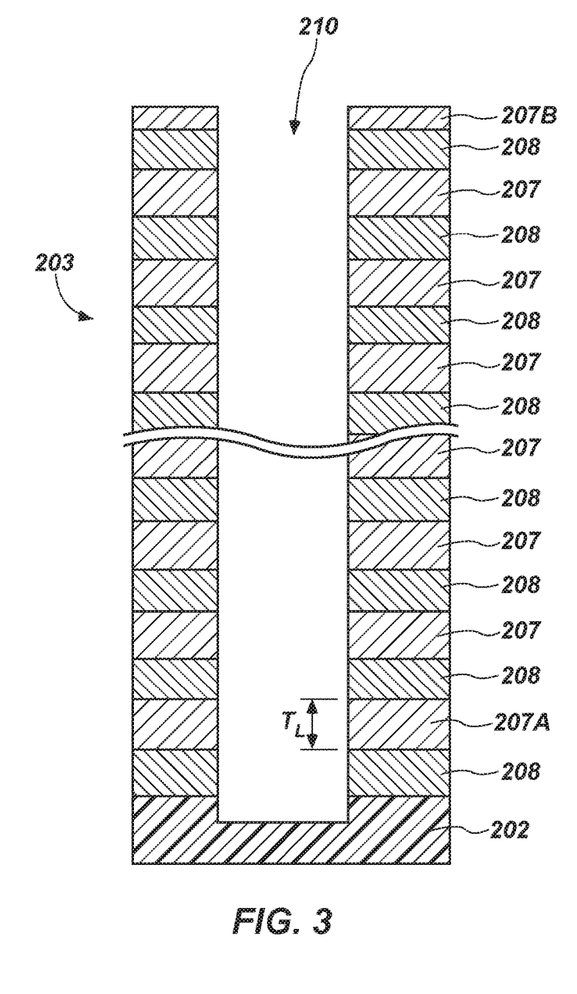
FIGS. 3-14 are cross-sectional side views illustrating a method of forming a memory device including vertical strings of memory cells, at various stages of the method, according to an embodiment of this disclosure.

Referring to FIG. 3, a stack 203 of alternating first dielectric materials 207 and second dielectric materials 208 may be formed over a substrate 202, and vertical channels 210 may be formed through the stack 203 to expose the substrate 202. The substrate 202 may be, or include, a semiconductor material, such as silicon (e.g., polysilicon) or silicon germanium, for example.

The first dielectric materials 207 and second dielectric materials 208 may be formed over the substrate 202 in alternating fashion. The stack 203 may be formed with any number of respective first dielectric materials 207 and second dielectric materials 208, such as about 32, about 64, about 96, or about 128, for example. The formation of the first and second dielectric materials 207, 208 may be accomplished by, for example, chemical vapor deposition (CVD), atomic layer deposition (ALD), a spin-on process, etc. The first and second dielectric materials 207, 208 may be different from, and may exhibit etch selectivity with respect to, each other. For example, the first dielectric materials 207 may be or include silicon nitride and the second dielectric materials 208 may be or include silicon oxide. A lowermost first dielectric material 207A may be formed to have a greater vertical thickness $T_L$ (e.g., about 45 nm) than each the remaining first dielectric materials 207 in the stack 203 (which may have a vertical thickness of, e.g., about 35 nm). An uppermost first dielectric material 207B may serve as a sacrificial protective barrier for the stack 203 during subsequent processing steps.

As described below (FIG. 13), the first dielectric materials 207 or portions thereof may later be removed and replaced by conductive gate materials 206. However, in other embodiments, the stack 203 may be initially formed to include the alternating conductive gate materials 206 in place of the first dielectric materials 207.

After the stack 203 is formed over the substrate 202, portions of the stack 203 may be removed to form the vertical channels 210 through the stack 203 to expose the substrate 202 at a base of the vertical channels 210. The portions of the stack 203 may be removed by an anisotropic photolithographic process, including formation of a mask material (not shown) over the stack 203, photolithographically patterning and developing the mask material to remove material and form openings over the intended locations of the vertical channels 210, and removing (e.g., etching) the portions of the first and second dielectric materials 207, 208 directly beneath the openings in the mask.

Figure 4:
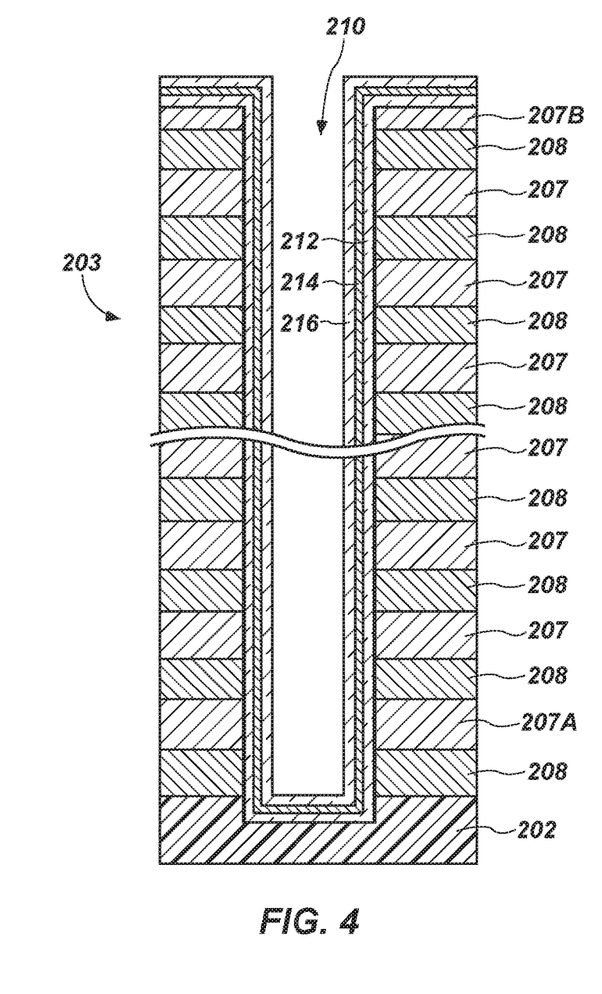

Referring to FIG. 4, an outer oxide liner 212, nitride liner 214, and inner oxide liner 216 may be formed within and along internal sidewalls of the vertical channel 210, as well as over a top surface of the stack 203 and over the exposed portion of the substrate 202 at the base of the vertical channel 210. The outer oxide liner 212, nitride liner 214, and inner oxide liner 216 may be formed by a conformal deposition process, such as ALD.

Figure 5:
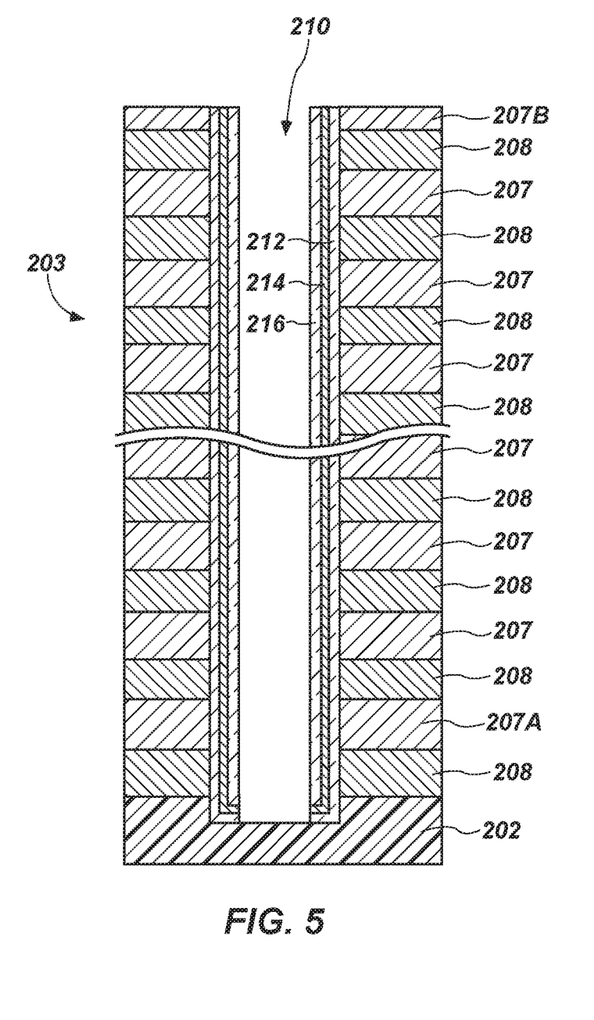

Referring to FIG. 5, portions of the outer oxide liner 212, nitride liner 214, and inner oxide liner 216 that are formed over horizontal surfaces, such as over the top surface of the stack 203 and over the exposed surface of the substrate 202 at the base of the vertical channel 210, may be removed. The removal may be accomplished by, for example, forming a polysilicon liner (not shown) over the inner oxide liner 216, removing portions of the polysilicon liner over the horizontal surfaces, and performing an anisotropic etching process to expose portions of the inner oxide liner 216 over the horizontal surfaces. The polysilicon liner may remain over vertical surfaces of the inner oxide liner 216 to protect the inner oxide liner 216 from a subsequent material removal process. Portions of the inner oxide liner 216, nitride liner 214, and outer oxide liner 212 exposed through the polysilicon liner may be removed by a chemical etching process. The polysilicon liner may then be removed. Portions of the outer oxide liner 212, nitride liner 214, and inner oxide liner 216 that are formed over vertical surfaces, such as over the internal sidewalls of the vertical channel 210, may remain after the removal process, as shown in FIG. 5.

Figure 6:
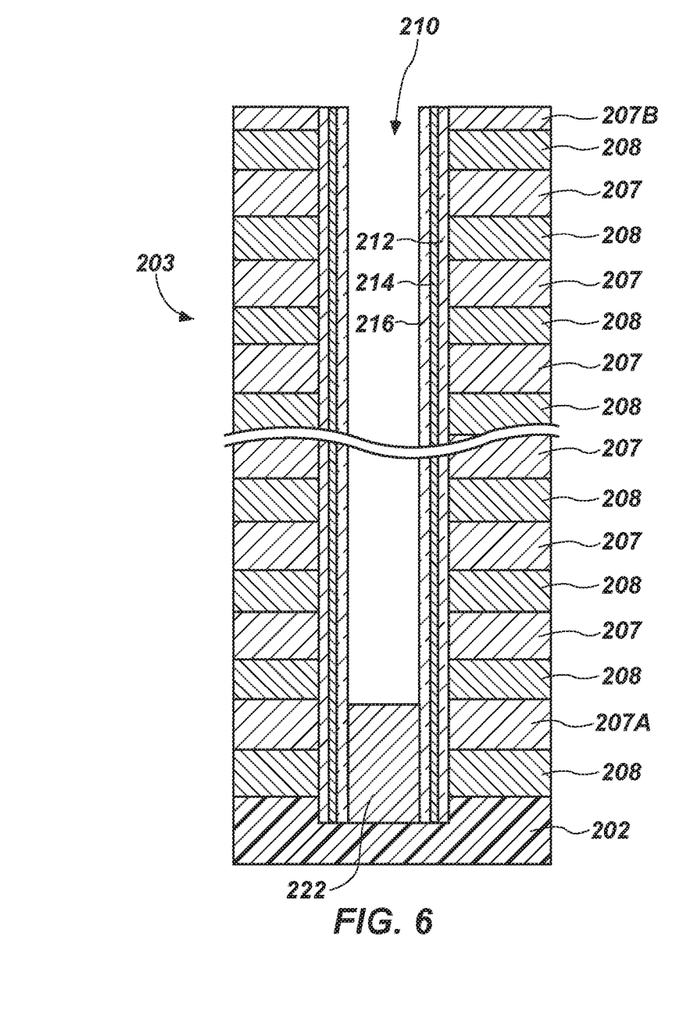

Referring to FIG. 6, a bottom plug material 222 may be formed within and at a base of the vertical channel 210. The bottom plug material 222 may be a semiconductor material exhibiting a room temperature band gap of less than about 1.10 eV. By way of example, the bottom plug material 222 may be or include silicon germanium, germanium, or indium gallium arsenide. The bottom plug material 222 may include an n-type dopant. Forming the bottom plug material 222 from a material that exhibits a band gap of less than about 1.10 eV may increase a GIDL current in string erase operations of a resulting device, compared to bottom plug materials exhibiting a higher band gap.

In some embodiments, the bottom plug material 222 may be epitaxially grown, using the substrate 202 (e.g., polysilicon) as a seed material. The bottom plug material 222 may be formed to at least partially overlap the lowermost first dielectric material 207A. By way of example and not limitation, an upper extent of the bottom plug material 222 may be about one-half to about two-thirds up the vertical thickness of the lowermost first dielectric material 207A. Previously forming the lowermost first dielectric material 207A to have a greater thickness $T_L$ (FIG. 3) than the remaining first dielectric materials 207 allows for a wider margin of error when forming the bottom plug material 222 to have an upper extent in an intended location relative to the lowermost first dielectric material 207A.

Figure 7:
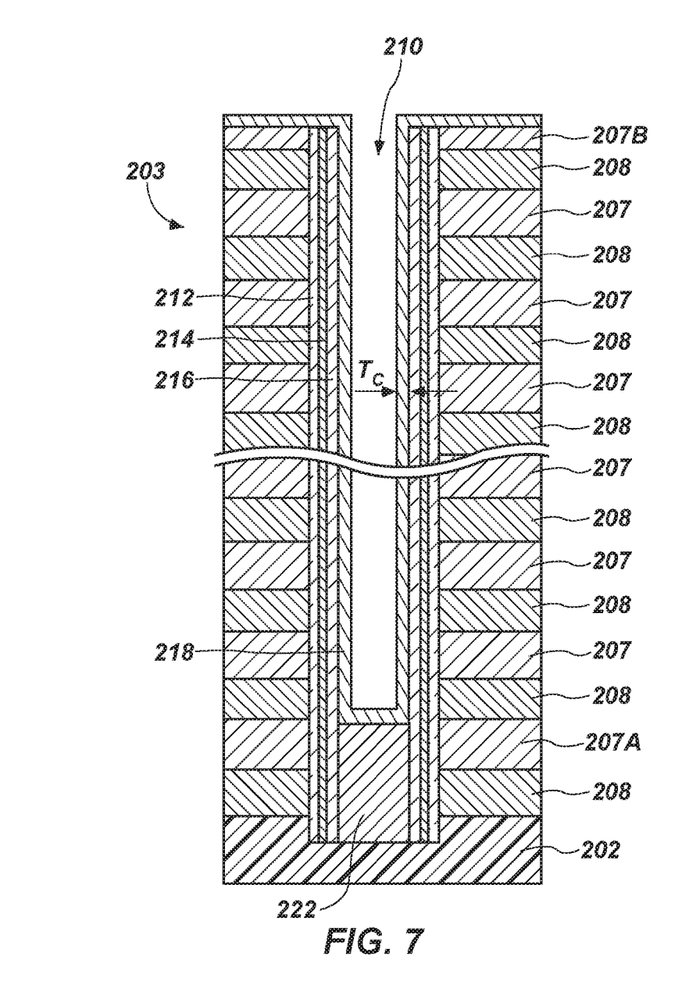

Referring to FIG. 7, a channel material 218 may be formed within the vertical channel 210. In some embodiments (as shown in FIG. 7), the channel material 218 may be formed as a conformal film along the inner sidewalls of the vertical channel 210, over the bottom plug material 222, and over a top surface of the stack 203. In such embodiments, the channel material 218 may have a thickness $T_C$ of less than about 25 nm, for example, such as between about 5 nm and about 20 nm. Forming the channel material 218 as a conformal film may result in better electrical performance of a resulting memory device, compared to forming the channel material 218 to substantially fill the vertical channel 210. Nonetheless, in other embodiments, the channel material 218 may be formed to substantially fill the vertical channel 210, such as to reduce manufacturing costs.

The channel material 218 may be a semiconductor material exhibiting an electron mobility of at least about 30 $cm^2/(V \cdot s)$ and a room temperature band gap of at least about 1.40 eV. By way of example and not limitation, the channel material 218 may be or include zinc oxide, silicon carbide, indium phosphide, indium gallium zinc oxide, or gallium arsenide, as well as so-called "2D materials," such as molybdenum disulfide. The channel material 218 may include stoichiometric variations of the listed materials, and/or combinations of materials such as indium and gallium. The channel material 218 may have different composition ratios. The channel material 218 may be formed using a conformal deposition process, such as ALD. By way of example and not limitation, the channel material 218 may be undoped, or may include a p-type dopant or an n-type dopant.

Figure 8:
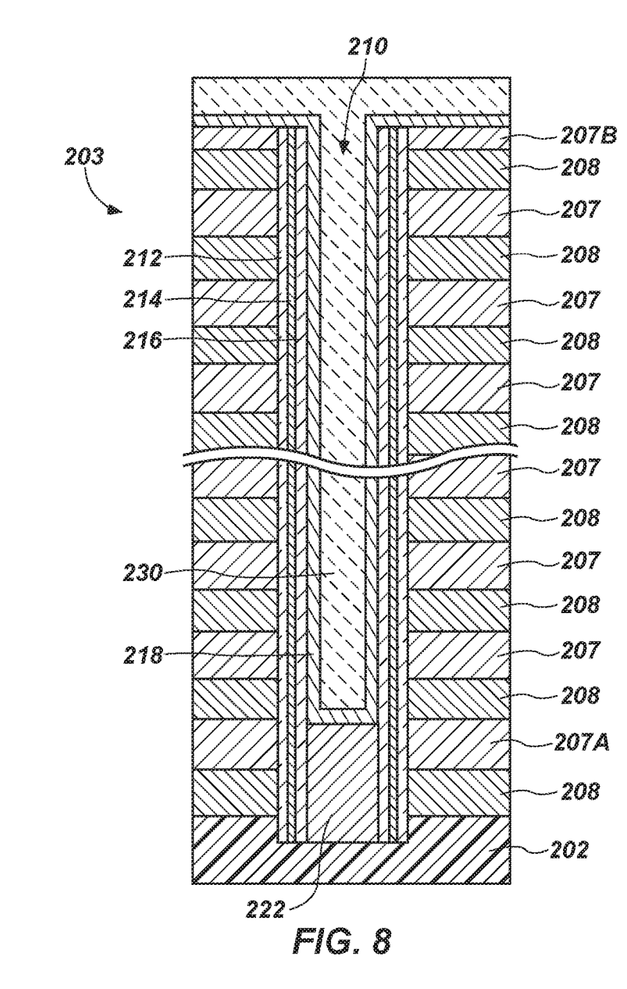

Referring to FIG. 8, in embodiments in which the channel material 218 is formed as a conformal film (i.e., not substantially filling the vertical channel 210), a central dielectric 230 may be formed to substantially fill the vertical channel 210 adjacent to the channel material 218. In some embodiments, an air-filled void may be left within the vertical channel 210 adjacent to the channel material 218. If formed of a solid dielectric material, the central dielectric 230 may be any dielectric material, such as an oxide material (e.g., silicon oxide). For example, the central dielectric may be formed of a so-called "spin-on dielectric" or "SOD" material by depositing a flowable dielectric over the stack 203 and spinning the substrate 202 to spread the flowable dielectric across upper surfaces of the stack 203 and into the vertical channels 210. The flowable dielectric may then be densified, such as by heat or chemical treating.

Figure 9:
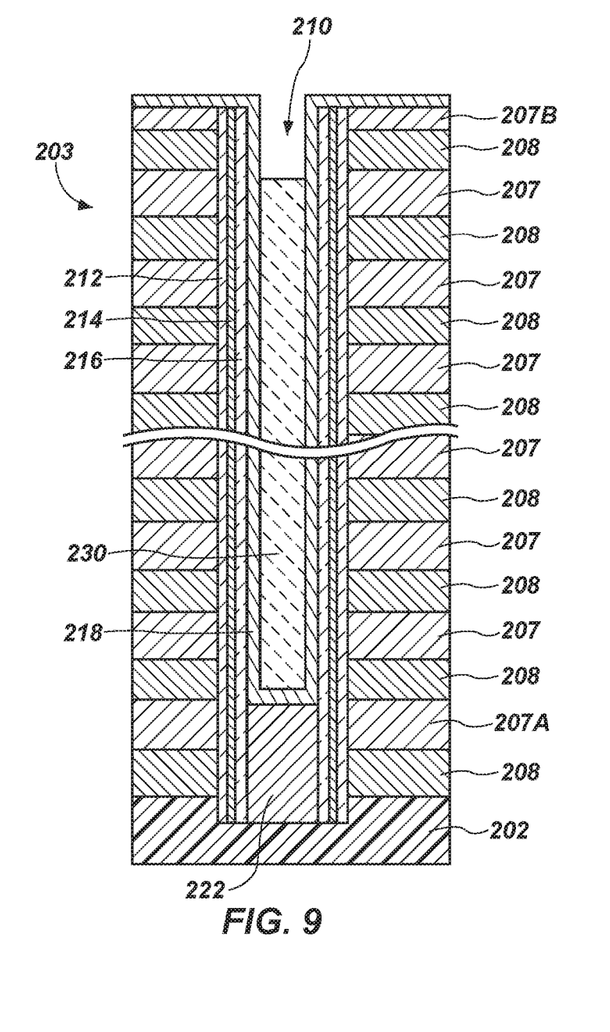

Referring to FIG. 9, portions of the central dielectric 230 over a top surface of the stack 203 may be removed, such as by a chemical-mechanical planarization (CMP) process. A portion of the remaining central dielectric 230 proximate a top of the vertical channel 210 may be removed, to recess a top surface of the central dielectric 230 below the top surface of the stack 203. The central dielectric 230 may be recessed by an etch process, such as by exposing the central dielectric to an etchant configured to remove the material of the central dielectric 230 but that does not remove the material of the channel material 218. The central dielectric 230 may be recessed to a vertical level such that a space above the central dielectric 230 at least partially overlaps with what will become an uppermost select gate drain (e.g., an upper first dielectric material 207 that will be replaced by a conductive gate material 206 (FIG. 13) configured for functioning as an uppermost select gate drain).

Figure 10:
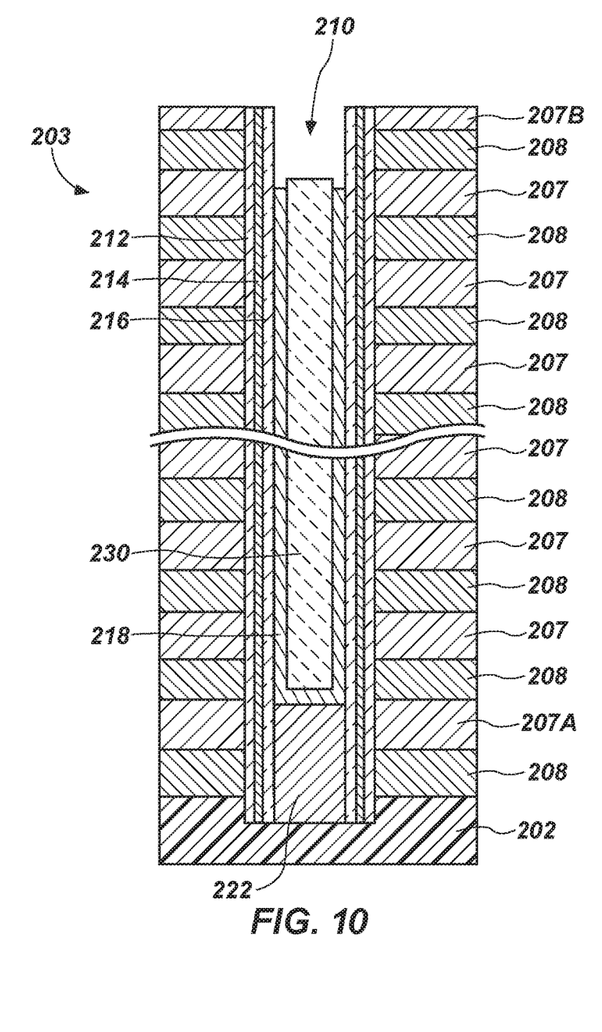

Referring to FIG. 10, portions of the channel material 218 over a top surface of the stack 203 and within the vertical channel 210 above the recessed central dielectric 230 may be removed, such as using an etch configured to remove the channel material 218 but not remove the first or second dielectric materials 207, 208, outer oxide liner 212, nitride liner 214, inner oxide liner 216, or central dielectric 230. By way of non-limiting example, the portions of the channel material 218 may be removed by exposure to a solution of hydrofluoric acid and water, hydrochloric acid and water, or phosphoric acid and water.

Figure 11:
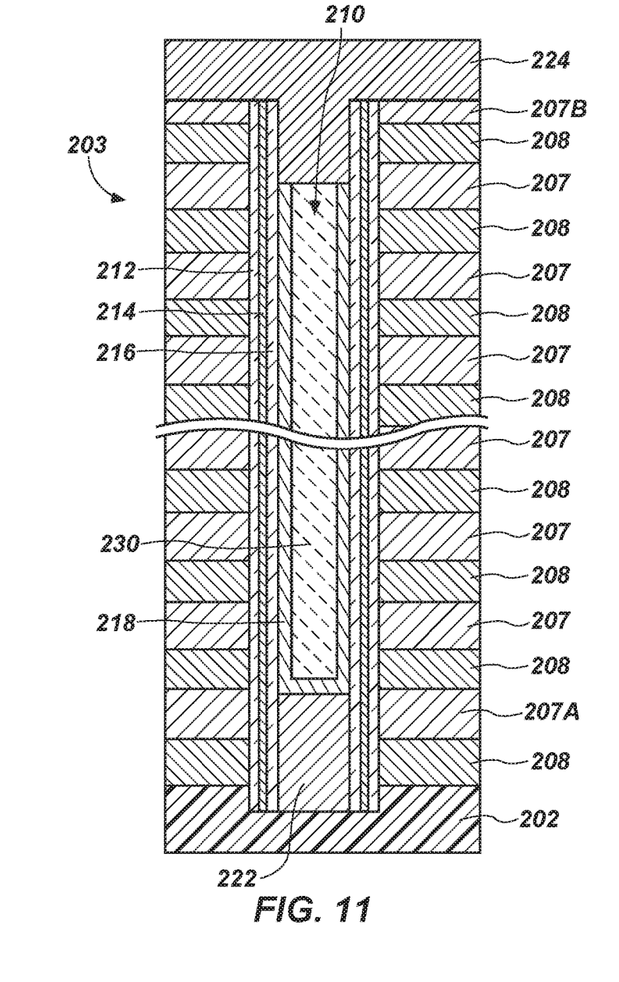

Referring to FIG. 11, a top plug material 224 may be formed within the vertical channel 210 and electrically coupled to the channel material 218. The top plug material 224 may be a semiconductor material, such as polysilicon, silicon germanium, or germanium, for example. The top plug material 224 may include an n-type dopant. The process for forming the top plug material 224 may be, for example, CVD. The top plug material 224 may initially be formed over a top surface of the stack 203, in addition to within the vertical channel 210.

Figure 12:
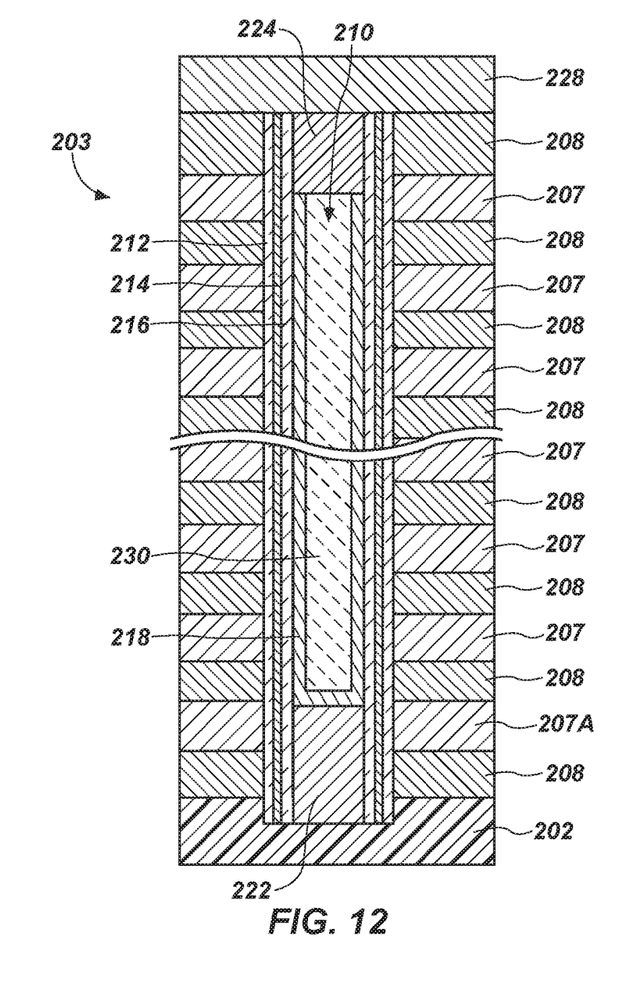

Referring to FIG. 12, portions of the top plug material 224 over a top surface of the stack 203 may be removed, such as by CMP or etching. In addition, the uppermost first dielectric material 207B, which previously served as a sacrificial barrier layer during prior processing acts, may be removed, such as by CMP or etching. A cap dielectric material 228 may be formed over the stack 203. The cap dielectric material 228 may include one or more dielectric materials, such as silicon oxide and/or silicon nitride.

Figure 13:
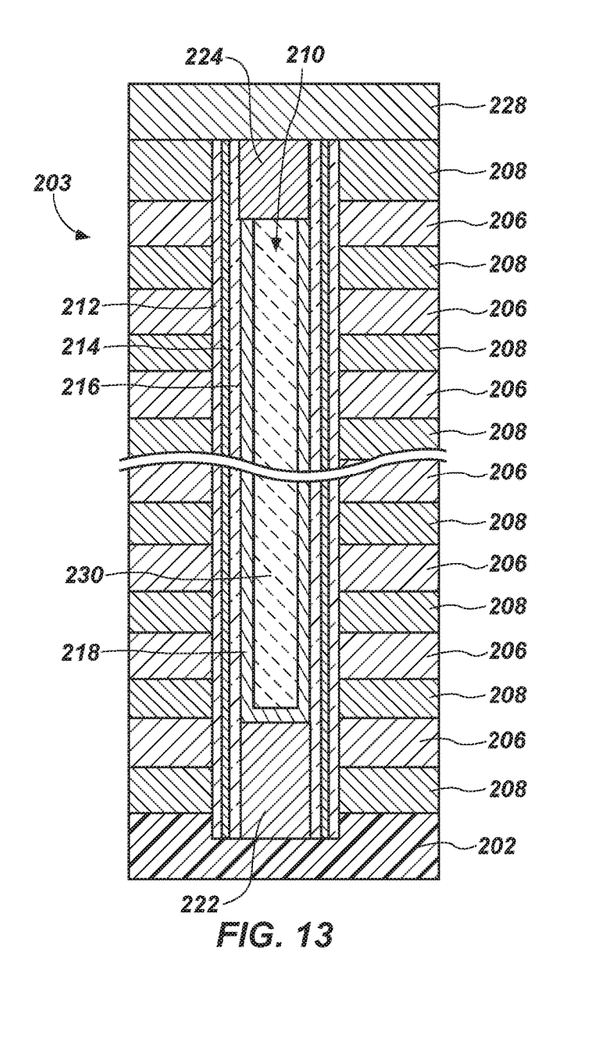

Referring to FIG. 13, the first dielectric materials 207 may be removed and replaced by conductive gate materials 206. To remove the first dielectric materials 207, one or more openings (not shown) may be formed through the stack 203 to expose each of the first dielectric materials 207 in the stack 203. An isotropic material removal process may be performed to selectively remove the first dielectric materials 207, without removing the second dielectric material 208. For example, an etchant may be introduced into the one or more openings and in contact with the first dielectric materials 207 to remove the first dielectric materials 207 and to form gaps between the second dielectric materials 208. After the first dielectric materials 207 are removed, the conductive gate materials 206 may be formed by introducing a conductive material (e.g., one or more of titanium, titanium nitride, tantalum, tantalum nitride, tungsten, or tungsten nitride) into the one or more openings and into the gaps left by removal of the first dielectric materials 207, such as by a deposition process (e.g., CVD or ALD). Any residual conductive material within the openings may be removed, and the openings may be filled with a dielectric material.

The process of forming the conductive gate materials 206 described above, including forming the outer oxide liner 212, nitride liner 214, inner oxide liner 216, and channel material 218 prior to replacing the first dielectric materials 207 with the conductive gate materials 206 introduced through openings, may be referred to as a so-called "replacement gate" process. However, this disclosure is not limited to forming the conductive gate materials 206 using such a replacement gate process. Rather, this disclosure is also applicable to a so-called "floating gate" process, in which portions of first dielectric materials 207 are replaced with conductive gate materials 206 introduced through the vertical channels 210 prior to forming the outer oxide liner 212, nitride liner 214, inner oxide liner 216, and channel material 218.

Figure 14:
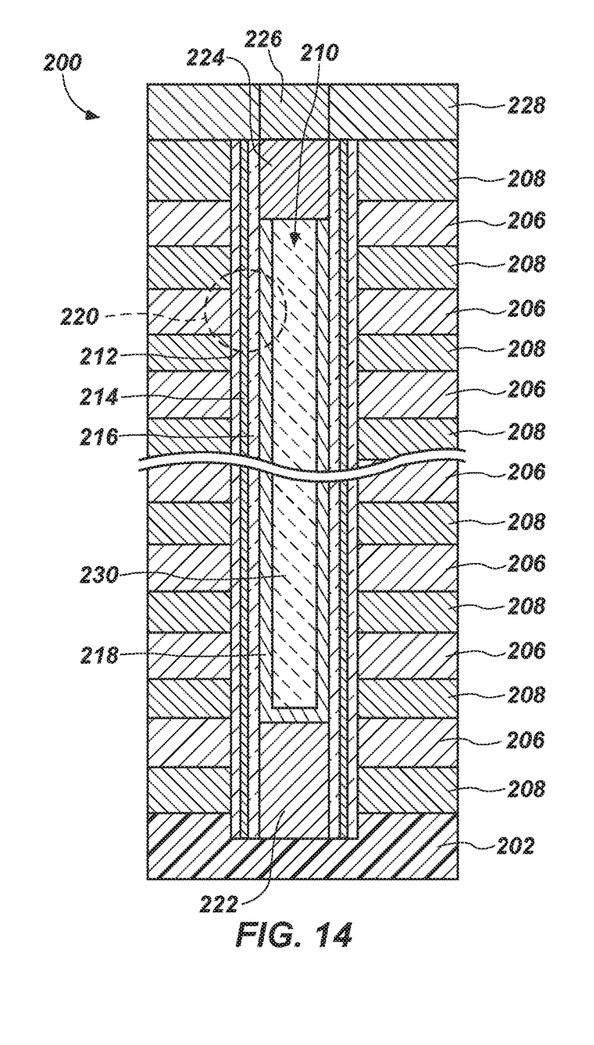

Referring to FIG. 14, when the conductive gate materials 206 are formed, an individual conductive gate material 206 and an adjacent portion of the outer oxide liner 212, nitride liner 214, inner oxide liner 216, and channel material 218 may define an individual memory cell 220. The group of memory cells 220 located along a particular vertical channel 210 may define a vertical string of memory cells 220.

Still referring to FIG. 14, a data line 226 (e.g., bit line) may be formed over and electrically coupled to the top plug material 224 for providing electrical access to the vertical string of memory cells 220. To form the data line 226, portions of the cap dielectric material 228 may be removed (e.g., via photolithography) to define trenches (not shown) within the cap dielectric material 228, exposing the top plug material 224. A conductive material, such as tungsten, tungsten nitride, titanium, titanium nitride, tan may be deposited into the trenches, such as using CVD, to form data lines 226. Any residual conductive material over a top surface of the cap dielectric material 228 may be removed, such as by CMP. The data lines 226 may extend horizontally into and out of the page from the perspective shown in FIG. 14.

Accordingly, embodiments of this disclosure include methods of forming memory devices. In accordance with such methods, a stack of alternating conductive gate materials and dielectric materials is formed. Vertical channels are formed to extend through the stack. A bottom plug material, channel material, and top plug material are formed within the vertical channels. The bottom plug material exhibits a room temperature band gap of less than about 1.10 eV. The channel material exhibits an electron mobility of at least about 30 cm$^2$/(V·s) and a room temperature band gap of at least about 1.40 eV.

The channel materials and bottom plug materials disclosed herein may provide enhanced current transmission in 3D memory arrays, which may be suitable for use with devices having an increased number of stacked transistors. The increased band gap of the disclosed channel materials may reduce boosting leakage compared to certain conventional channel materials, such as polysilicon. In addition, the channel materials and bottom plug materials may be applicable to all 3D memory architectures including select gate source and select gate drain transistors. The channel materials and bottom plug materials may also result in fewer defects and traps than certain conventional channel materials. Moreover, the bottom plug materials disclosed herein may result in increased GIDL current values for improved string erase operations.

Figure 15:
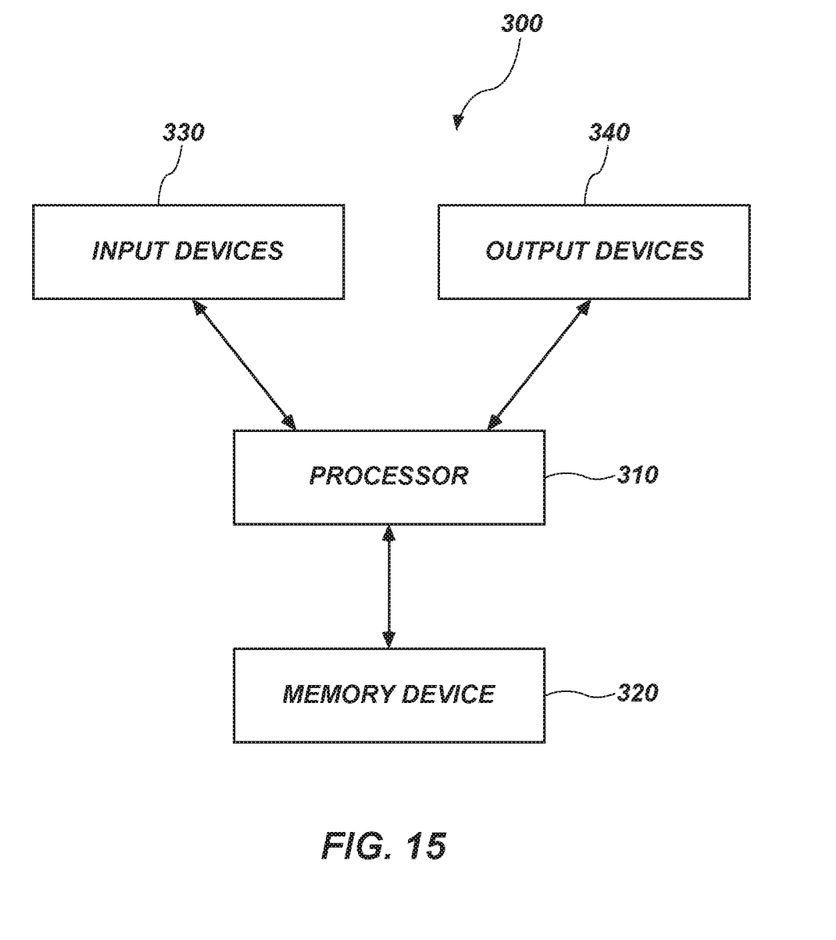
FIG. 15 shows a schematic block diagram of an electronic system according to an embodiment of the present disclosure.

FIG. 15 is a schematic block diagram of an electronic system 300 according to an embodiment of the present disclosure. The electronic system 300 includes a processor 310 electrically coupled with a memory device 320, one or more input devices 330, and one or more output devices 340. The electronic system 300 may be a consumer electronic device, such as a desktop computer, a laptop computer, a tablet computer, an electronic reader, a smart phone, or other type of communication device, as well as any type of computing system incorporating a memory device. The memory device 320 may be or include a memory device (e.g., one or more of the memory devices 100, 200) that includes a channel material exhibiting an electron mobility of at least about 30 cm$^2$/(V·s) and a room temperature band gap of at least about 1.40 eV (e.g., ZnO, IGZO, SiC, InP, GaAs, MoS$_2$), as well as a bottom plug material exhibiting a room temperature band gap of less than about 1.10 eV (e.g., silicon germanium, germanium, or indium gallium arsenide), as discussed above.

Accordingly, embodiments of this disclosure include electronic systems including a processor and a memory device electrically coupled to the processor. The memory device includes an array of vertical memory cells positioned along respective vertical channels to define vertical memory strings. Each of the vertical channels includes a channel material selected from the group consisting of zinc oxide, silicon carbide, indium phosphide, indium gallium zinc oxide, gallium arsenide, and molybdenum disulfide, and a bottom plug material electrically coupled to a base of the channel material, the bottom plug material selected from the group consisting of silicon germanium, germanium, and indium gallium arsenide.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. An apparatus, comprising:
   at least one memory cell comprising:
   an outer oxide material;
   a nitride material laterally adjacent to the outer oxide material;
   an inner oxide material laterally adjacent to the nitride material; and
   a channel material laterally adjacent to the inner oxide material, the channel material exhibiting a first band gap;

a semiconductor material adjacent to the channel material, the semiconductor material exhibiting a second band gap that is relatively smaller than the first band gap; and a base material underlying the at least one memory cell, the base material exhibiting a third band gap that is relatively smaller than the first band gap, wherein portions of each of the outer oxide material, the nitride material, the inner oxide material, and the semiconductor material are vertically recessed within the base material.

2. The apparatus of claim 1, wherein the semiconductor material is in direct physical contact with each of the channel material and the base material.

3. The apparatus of claim 1, wherein at least a portion of the base material is laterally adjacent to the outer oxide material.

4. The apparatus of claim 1, wherein the base material is in direct physical contact with each of the outer oxide material, the nitride material, the inner oxide material, and the semiconductor material.

5. The apparatus of claim 1, wherein lower surfaces of each of the outer oxide material, the nitride material, the inner oxide material, and the semiconductor material are substantially coplanar with one another.

6. The apparatus of claim 1, further comprising stacks of conductive gate materials, wherein a vertical thickness of a lowermost conductive gate material of the stacks of conductive gate materials is greater than respective vertical thicknesses of other conductive gate materials of the stacks, the semiconductor material at least partially vertically overlapping the lowermost conductive gate material.

7. The apparatus of claim 1, wherein:
the channel material comprises zinc oxide, silicon carbide, indium phosphide, indium gallium zinc oxide, gallium arsenide, or molybdenum disulfide; and
the semiconductor material comprises silicon germanium, germanium, or indium gallium arsenide.

8. The apparatus of claim 1, wherein:
the channel material exhibits a room temperature band gap of between about 1.40 eV and about 3.3 eV; and
the semiconductor material exhibits a room temperature band gap of between about 0.66 eV and about 1.10 eV.

9. A method of forming an apparatus, comprising:
forming a stack of alternating conductive materials and dielectric materials overlying a base material;
forming an opening through the stack;
forming an outer oxide material within the opening;
forming a nitride material within the opening and laterally adjacent to the outer oxide material;
forming an inner oxide material within the opening and laterally adjacent to the nitride material;
forming a semiconductor material within the opening and adjacent to each of the outer oxide material, the nitride material, and the inner oxide material, portions of each of the semiconductor material, the outer oxide material, the nitride material, and the inner oxide material being vertically recessed within the base material; and
forming a channel material adjacent to the semiconductor material within the opening, a band gap of the channel material different than a band gap of each of the semiconductor material and the base material.

10. The method of claim 9, wherein forming the semiconductor material comprises epitaxially growing the semiconductor material using the base material as a seed material, the semiconductor material comprising a silicon germanium material.

11. The method of claim 9, wherein forming the channel material comprises:
selecting the channel material to have a band gap relatively larger than a band gap of the semiconductor material; and
conformally forming the channel material along an exposed upper surface of the semiconductor material and along an internal sidewall of the inner oxide material.

12. The method of claim 9, further comprising forming a central dielectric material comprising at least one of an oxide material and an air-filled void laterally adjacent to the channel material.

13. The method of claim 9, further comprising:
forming another semiconductor material adjacent to the channel material; and
forming a data line adjacent to the another semiconductor material with lateral side surfaces of each of the channel material, the another semiconductor material, and the data line substantially coplanar with one another.

14. An apparatus, comprising:
a channel material extending vertically through a stack of alternating dielectric structures and conductive structures;
a liner material laterally adjacent to the channel material, the liner material extending vertically through the stack;
a semiconductor material underlying the channel material, a band gap of the semiconductor material being relatively smaller than a band gap of the channel material, wherein lower surfaces of the liner material and the semiconductor material are substantially coplanar with one another; and
a dielectric material centrally located within the channel material, the dielectric material extending vertically through the stack.

15. The apparatus of claim 14, further comprising a base material laterally adjacent to each of the liner material and the semiconductor material, wherein the base material is electrically coupled to the channel material through the semiconductor material.

16. The apparatus of claim 14, wherein an outer sidewall of the channel material is substantially aligned with an outer sidewall of the semiconductor material.

17. The apparatus of claim 14, further comprising another semiconductor material overlying the channel material and the dielectric material, wherein each of the channel material, the semiconductor material, and the another semiconductor material comprises an n-type dopant.

18. The apparatus of claim 17, wherein the another semiconductor material is laterally adjacent to the liner material, the another semiconductor material at least partially vertically overlapping an uppermost conductive gate material within the stack of alternating dielectric structures and conductive structures.

19. The apparatus of claim 14, wherein the apparatus comprises a 3D NAND Flash memory device comprising at least one memory array of memory cells, individual memory cells of the at least one memory array including portions of each of the channel material, the liner material, and individual conductive structures of the stack of alternating dielectric structures and conductive structures.

20. An apparatus, comprising:
a channel material extending vertically through a stack of alternating dielectric structures and conductive structures;

a liner material laterally adjacent to the channel material, the liner material extending vertically through the stack, the liner material comprising an outer oxide material adjacent to the stack of alternating dielectric structures and conductive structures, an inner oxide material adjacent to the channel material, and a nitride material between the outer oxide material and the inner oxide material;

a semiconductor material underlying the channel material, a band gap of the semiconductor material being relatively smaller than a band gap of the channel material, wherein lower surfaces of the liner material and the semiconductor material are substantially coplanar with one another; and a central dielectric material laterally adjacent to the channel material, the central dielectric material extending vertically through the stack.

* * * * *